United States Patent
Hon et al.

(10) Patent No.: US 7,154,163 B2
(45) Date of Patent: Dec. 26, 2006

(54) EPITAXIAL STRUCTURE OF GALLIUM NITRIDE SERIES SEMICONDUCTOR DEVICE UTILIZING TWO BUFFER LAYERS

(75) Inventors: Schang-Jing Hon, Pa Te (TW); Mu-Jen Lai, Chungli (TW)

(73) Assignee: Supernova Optoelectronics Corp., Taoyuan (TW)

( * ) Notice: Subject to any disclaimer, the term of this patent is extended or adjusted under 35 U.S.C. 154(b) by 0 days.

(21) Appl. No.: 10/838,186

(22) Filed: May 5, 2004

(65) Prior Publication Data
US 2005/0247942 A1    Nov. 10, 2005

(51) Int. Cl.
*H01L 29/201* (2006.01)
*H01L 31/0304* (2006.01)

(52) U.S. Cl. .................. 257/615; 257/E31.022
(58) Field of Classification Search ............. 257/76, 257/615, E31.019, E31.022
See application file for complete search history.

(56) References Cited

U.S. PATENT DOCUMENTS

| 5,290,393 A | | 3/1994 | Nakamura ................ 156/613 |
|---|---|---|---|
| 5,959,307 A | * | 9/1999 | Nakamura et al. ............ 257/14 |
| 6,033,490 A | * | 3/2000 | Kimura et al. ............. 148/33.4 |
| 6,072,818 A | * | 6/2000 | Hayakawa ............. 372/46.014 |
| 6,252,261 B1 | | 6/2001 | Usui et al. ................... 257/190 |
| 6,475,882 B1 | | 11/2002 | Sakai et al. ................. 438/483 |
| 6,533,874 B1 | * | 3/2003 | Vaudo et al. .............. 148/33.5 |
| 2002/0013042 A1 | * | 1/2002 | Morkoc ..................... 438/604 |
| 2004/0261693 A1 | * | 12/2004 | Lai et al. ....................... 117/86 |

* cited by examiner

*Primary Examiner*—Stephen W. Smoot
(74) *Attorney, Agent, or Firm*—Rosenberg, Klein & Lee

(57) ABSTRACT

An epitaxial structure of a gallium nitride series semiconductor device and a process of forming the same are described. A first buffer layer of gallium nitride is epitaxially formed on a substrate at a first temperature. A second buffer layer of indium gallium nitride is formed on the first buffer layer at a second temperature. The second temperature increases up to a third temperature, during which precursors including $In(CH_3)_3$ and $NH_3$ are used for surface treatment. A high-temperature gallium nitride is formed at the third temperature. The buffer layer and the way to form such a buffer layer allow improved crystal configuration and lowered defect density, thereby increasing the performance and service life of a semiconductor device.

10 Claims, 5 Drawing Sheets

EPITAXIAL STRUCTURE OF GALLIUM NITRIDE SERIES SEMICONDUCTOR DEVICE UTILIZING TWO BUFFER LAYERS

BACKGROUND OF THE INVENTION

1. Field of the Invention

The invention generally relates to an epitaxial structure of a gallium nitride semiconductor device and a process of manufacturing the same, and more particularly to a process of growing an epitaxial layer as a buffer layer.

2. Description of the Related Art

Illumination devices can be formed of different layers. In the case that the layers are epitaxially formed, defects are inevitably generated in their crystal structures. Performance of the illumination devices is adversely affected thereby in several aspects such as, for example, reduced illumination efficiency, lowered electron shifting, and prolonged diffusion paths for dopants. Moreover, V-shaped trenches, resulting in layer dislocation, appear in the quantum wells of active layers. Furthermore, initial reverse bias is also increased. If cracks or gaps appear in the crystal structure, an illumination device cannot be grown above the cracks or gaps, because the illumination device formed on such an area has a short service life and low illumination efficiency. Therefore, how to form an epitaxial layer with a perfect crystal structure is the key to improve the performance of the illumination device.

Gallium nitride series material can be used as a wide-bandgap semiconductor device that emits various lights, from green to violet. Gallium nitride bulks are difficult to grow so that, currently, gallium nitride must be formed on a sapphire- or SiC-based substrate. Lattice constant of the substrate is not consistent with that of gallium nitride. The gallium nitride layer directly formed on the substrate is not reliable and therefore a buffer layer must be formed between the substrate and the gallium nitride. The buffer layer is also called a nucleation layer with a lattice constant similar to that of the substrate. Nucleation and growth of gallium nitride are performed on the buffer layer to form a crystal structure significantly the same as the substrate, thereby increasing the crystallization of the gallium nitride-series layer. Therefore, the quality of the buffer layer greatly influences epitaxy of a cladding layer and an active layer subsequently formed, and indirectly influences properties of the illumination device.

U.S. Pat. No. 5,290,393 discloses a gallium nitride grown on a sapphire-based substrate, as shown in FIG. 1. A low-temperature aluminum nitride buffer layer 12 of 0.001–0.5 µm in thickness is formed on the sapphire-based substrate 11. A high-temperature aluminum gallium nitride buffer layer 13 is formed on the low-temperature aluminum nitride buffer layer 12. Generally, the temperature at which the low-temperature aluminum nitride buffer layer 12 is grown ranges from 200° C. to 900° C. The temperature at which the high-temperature aluminum gallium nitride buffer layer 13 is grown ranges from 900° C. to 1150° C. This method increases the crystallization of gallium nitride series compound. However, the defect density of 4 µm-thick aluminum gallium nitride layer 13 is still as high as $10^9$–$10^{10} cm^{-2}$. U.S. Pat. No. 6,252,261 uses an ELOG method to reduce the defect density, as shown in FIG. 2. A base layer 22 of gallium nitride is epitaxially grown by MOCVD on a sapphire-based substrate 21. The base layer 22 includes a low-temperature gallium nitride buffer layer and a high-temperature gallium nitride epitaxial layer. The substrate is taken out from a MOCVD chamber. A $(SiO_2)_{23}$ mask having 1–120 stripes partially overlaps the base layer 22. Then, HVPE or MOCVD is performed to grow epitaxially a high-temperature gallium nitride epitaxial layer 24. With the user of the $(SiO_2)_{23}$ mask, the epitaxial growing mechanism is selectively performed. The growth direction of the epitaxial layer vertical to that of the gallium nitride in the areas of the base layer not covered by the $(SiO_2)_{23}$ mask. After the formed epitaxial layer reaches the same level as the mask, the layer is continuously grown, faster than before, in the growth direction of the gallium nitride base layer, thereby preventing defects from spreading in the vertical direction. The defect density of the subsequently epitaxially grown gallium nitride layer is therefore reduced. However, the defect density is not reduced until the layer has a thickness more than 10 µm. This kind of lateral epitaxial growth effectively reduces the defect density, but complicates the production of the mask. Meanwhile, the selective growth mechanism increases the whole production cost.

U.S. Pat. No. 6,475,882 discloses a lateral epitaxial growth using a SiN micro-mask. Before an epitaxial process is conducted, precursors including $SiH_4$ and $NH_3$ form SiN islands on a sapphire-based substrate. The SiN islands are used as a mask for subsequent lateral epitaxial growth to reduce the defect density. According to this disclosure, the flow and the reaction time of the precursors are controlled so as to obtain an epitaxial film with good crystallization. However, the uniformity and the density of the SiN micromask are not easily controlled, and the yield is not easily controlled, either.

Therefore, there is a need for a process of forming an epitaxial layer, suitable for the formation of an epitaxial layer of an illumination device, the epitaxial layer having perfect crystallization and little dislocation, low cost and improved yield.

SUMMARY OF THE INVENTION

It is therefore an object of the invention to provide an epitaxial structure of a gallium nitride series semiconductor and a process of manufacturing the same. A first buffer layer made of gallium nitride is epitaxially grown over a substrate at a first temperature. A second buffer layer made of indium gallium nitride is formed on the first buffer layer at a second temperature. The second temperature is then increased to a third temperature. While the temperature is increasing, precursors such as $In(CH_3)_3$ and $NH_3$ are used for surface treatment of the second buffer layer. Thereafter, an epitaxial gallium nitride layer is grown at the third temperature. The structure of the obtained buffer layer and the process of growing such a buffer layer allow perfect crystal and low defect density, effectively increasing the performance and service life of a semiconductor device.

To provide a further understanding of the invention, the following detailed description illustrates embodiments and examples of the invention, this detailed description being provided only for illustration of the invention.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF THE EMBODIMENTS

Figure 1:
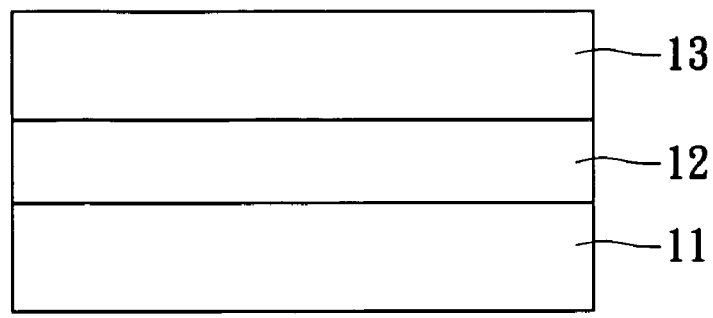
FIG. 1 is a schematic view of a conventional gallium nitride structure grown with the use of a buffer layer.
Figure 2:
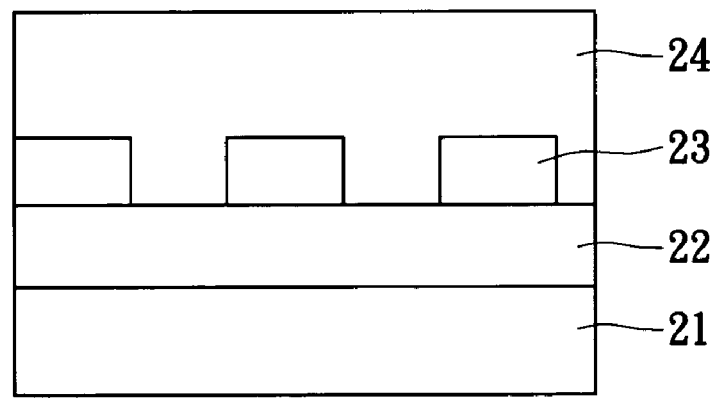
FIG. 2 is a schematic view of another conventional gallium nitride structure grown with the use of a buffer layer.

Wherever possible in the following description, like reference numerals will refer to like elements and parts unless otherwise illustrated.

Figure 3:
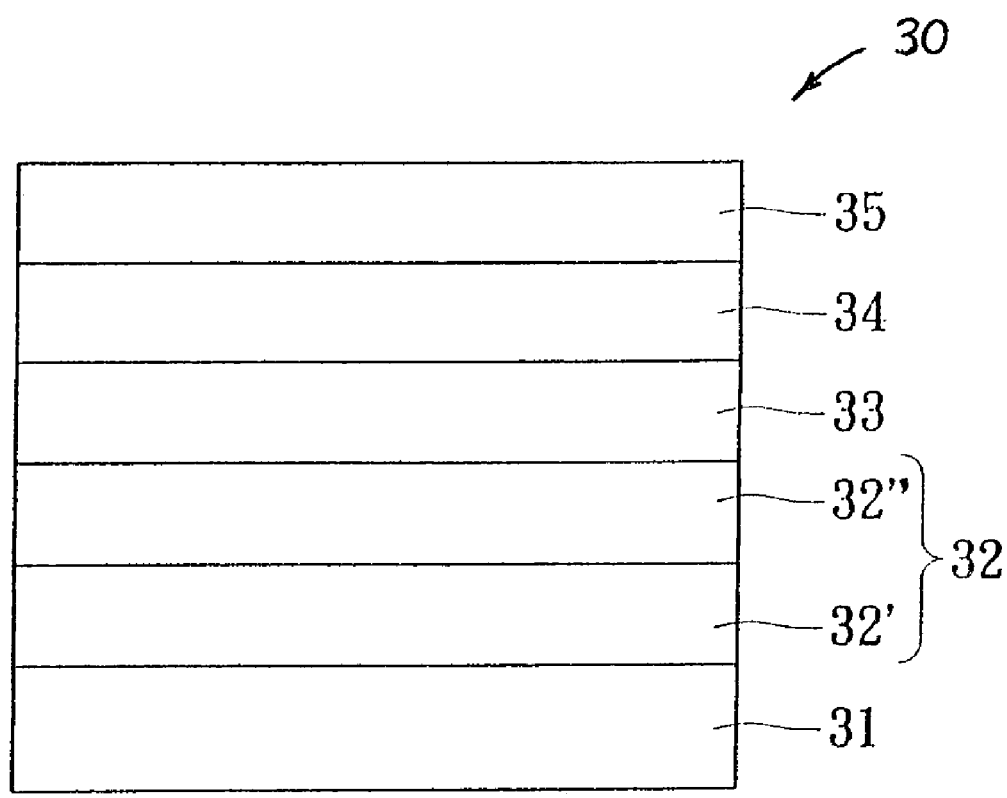
FIG. 3 is a front view of an epitaxial structure of a gallium nitride series semiconductor device according to one embodiment of the invention.

In one preferred embodiment of the invention, the invention provides an epitaxial structure of a gallium nitride series semiconductor device. Referring to FIG. 3, an epitaxial structure 30 includes a substrate 31, a first gallium nitride buffer layer 32, a second indium gallium nitride buffer layer 33 and an epitaxial gallium nitride layer 34. In the epitaxial structure 30, the substrate 31 is formed from sapphire, SiC, ZnO or Si. The first gallium nitride buffer layer 32 further includes, from bottom to top, a low-temperature gallium nitride buffer layer 32' and a high-temperature gallium nitride buffer layer 32''. Furthermore, the epitaxial structure 30 further includes an epitaxy gallium nitride layer 35 on the epitaxial gallium nitride 34.

Figure 4:
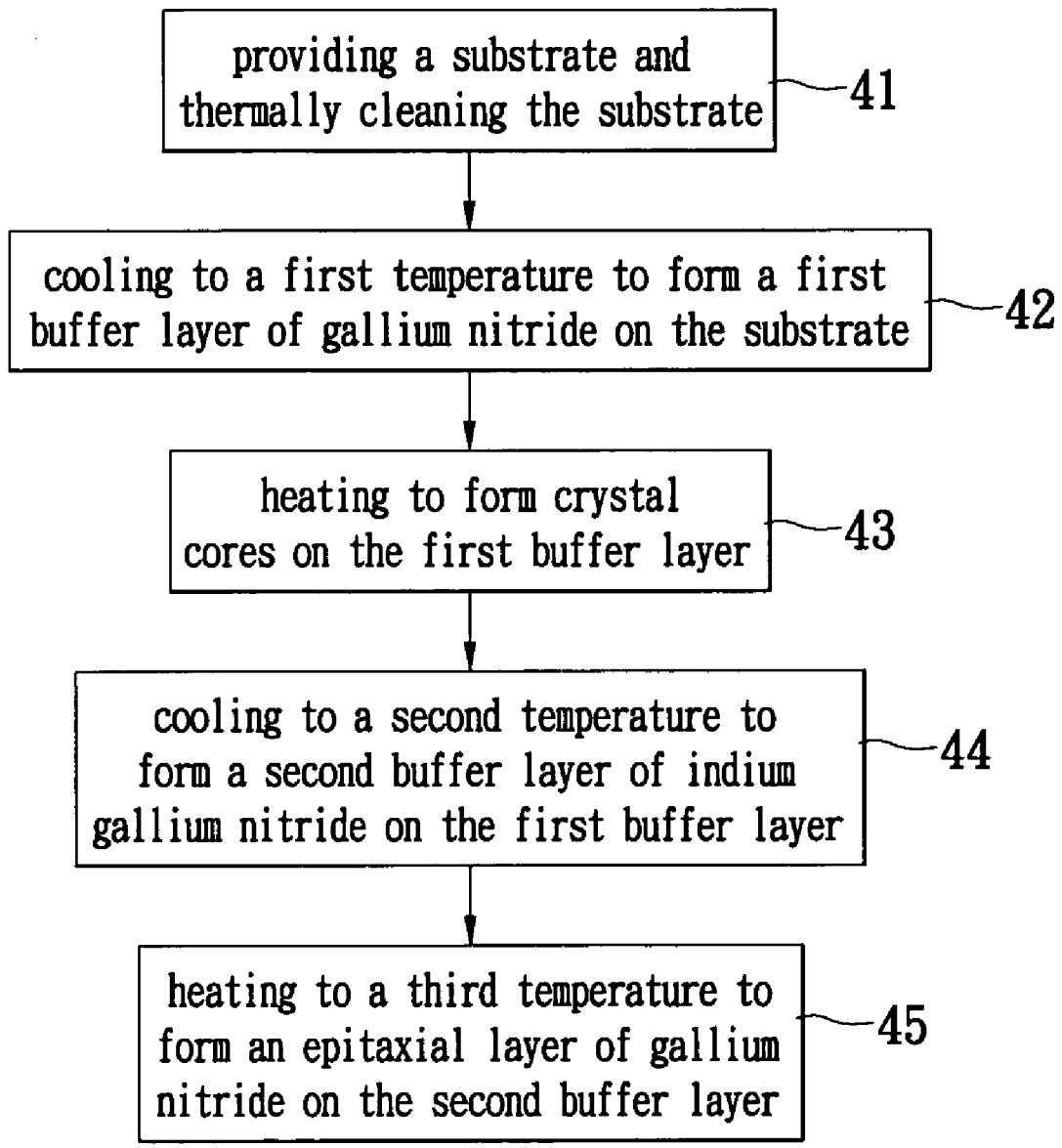
FIG. 4 is a flowchart of an epitaxial structure of a gallium nitride series semiconductor device according to one embodiment of the invention.

FIG. 4 is a flowchart illustrating the formation of the epitaxial structure according to one embodiment of the invention. A substrate 31 is provided, and a thermal cleaning is performed on the substrate 31 (step 41). The low-temperature gallium nitride buffer layer 32' is formed on the substrate 31 at the first temperature (step 42). Increased temperature allows the formation of crystal cores over the first gallium nitride buffer layer to form high-temperature gallium nitride buffer layer 32'' (step 43). The temperature is decreased to a second temperature at which the second buffer layer 33 is formed on the high-temperature gallium nitride buffer layer 32'' (step 44). The temperature increases to a third temperature at which the epitaxial gallium nitride layer 34 is formed on the second buffer layer 33 (step 45). The temperature relationship is as follows: the first temperature<the second temperature<the third temperature.

Figure 5:
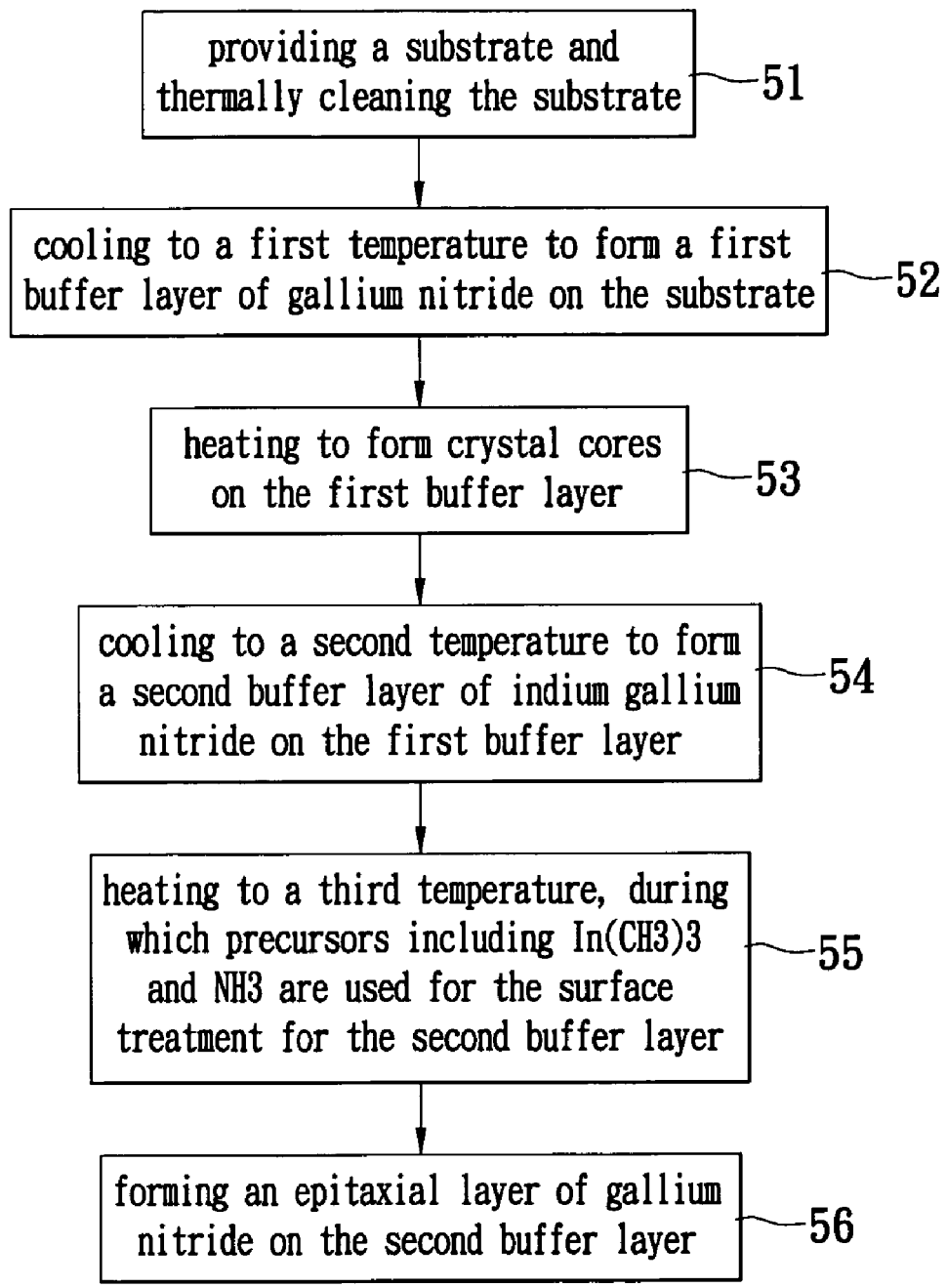
FIG. 5 is a flowchart of an epitaxial structure of a gallium nitride series semiconductor device according to another embodiment of the invention.

FIG. 5 is a flowchart illustrating the formation of an epitaxial structure according to another embodiment of the invention. The substrate 31 is provided and a surface cleaning is performed on the substrate 31 (step 51). The low-temperature gallium nitride buffer layer 32' is formed on the substrate 31 at the first temperature (step 52). As the temperature further increases, crystal cores are formed on the first buffer layer to form a high-temperature gallium nitride layer 32'' (step 53). The indium gallium nitride buffer layer 33 is formed on the high-temperature gallium nitride buffer layer 32'' when the third temperature is decreased to the second temperature (step 54). The second temperature is again increased to the third temperature. During this period, the precursors including $In(CH_3)_3$ and $NH_3$ are used to perform a surface treatment of the indium gallium nitride buffer layer 22 (step 55). The high-temperature epitaxial gallium nitride layer 34 is formed at the third temperature (step 56). The temperature relationship is as follows: the first temperature<the second temperature<the third temperature.

Figure 6:
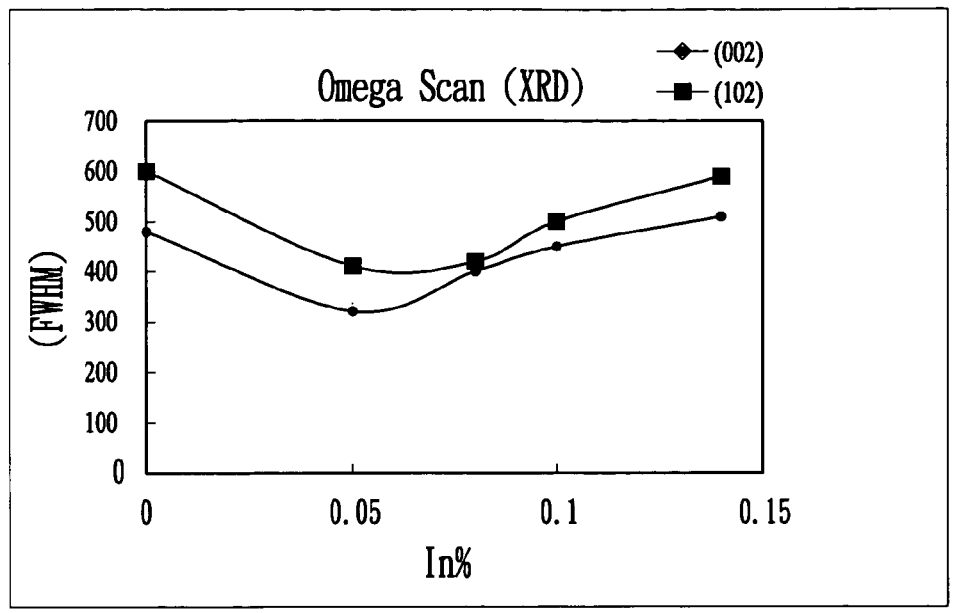
FIG. 6 is a FWHM graph of an indium gallium nitride layer obtained by the invention.
Figure 7:
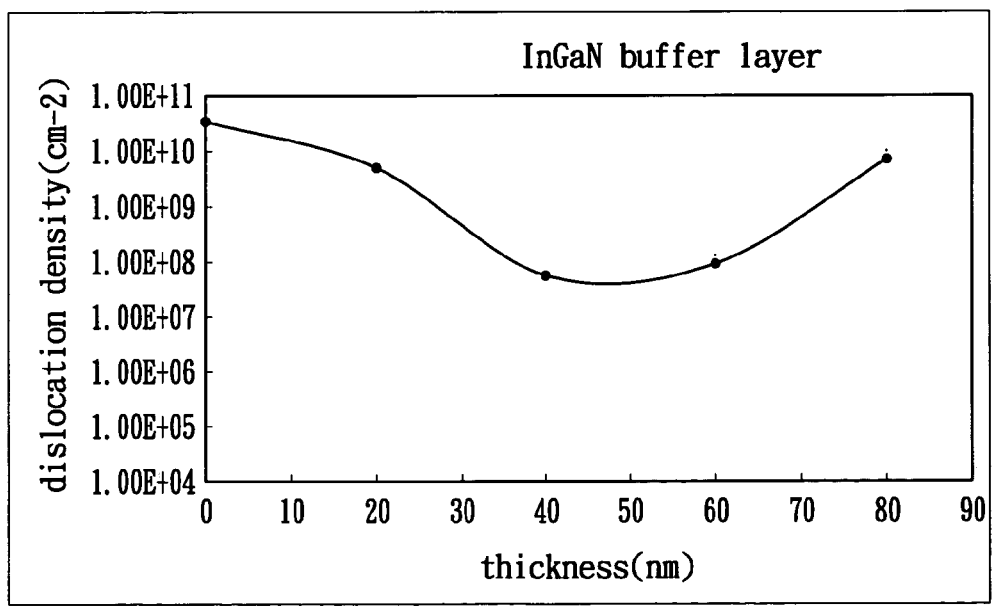
FIG. 7 is a phase difference of an epitaxial structure of an indium gallium nitride layer according to one embodiment of the invention.

When the epitaxial structure 30 is to be formed, the temperature (the first temperature) at which the first gallium nitride buffer layer 32 is formed is 400° C. to 800° C. THE first buffer layer 32 has a thickness of 20 nm to 40 nm, and has a multiple crystal structure epitaxially grown by metal organic chemical vapor deposition (MOCVD). The temperature (the second temperature) at which the second buffer layer 33 is formed is 830° C. to 880° C. The second buffer layer 33 has a thickness of 40 nm to 60 nm, and has a single crystal structure epitaxially grown by metal organic chemical vapor deposition (MOCVD). FIG. 6 is a FWHM growth of an indium gallium nitride layer. FIG. 7 is a phase difference of an indium gallium nitride layer. The epitaxial gallium nitride 34 has a single crystal structure, with a defect density lower than $1 \times 10^8$ $cm^{-2}$. The difference between the temperature at which the low-temperature gallium nitride buffer layer 32' is formed and the temperature at which the high-temperature gallium nitride buffer layer 32'' is formed must be more than 300° C. Furthermore, the material used to form the epitaxial gallium nitride series layer is one selected from the group consisting of the following components $B_xAl_yIn_zGa_{1-x-y-z}N_pAs_q$ ($0 \leq x \leq 1$, $0 \leq y \leq 1$, $0 \leq z \leq 1$, $0 \leq p \leq 1$, $0 \leq q \leq 1$, x+y+z=1, and p+q=1), and p-type $B_xAl_y$-$In_zGa_{1-x-y-z}N_pP_q$ ($0 \leq x \leq 1$, $0 \leq y \leq 1$, $0 \leq z \leq 1$, $0 \leq p \leq 1$, $0 \leq q \leq 1$, x+y+z=1 and p+q=1).

It should be apparent to those skilled in the art that the above description is only illustrative of specific embodiments and examples of the invention. The invention should therefore cover various modifications and variations made to the herein-described structure and operations of the invention, provided they fall within the scope of the invention as defined in the following appended claims.

What is claimed is:

1. An epitaxial structure of a gallium nitride series semiconductor device, comprising:
    a substrate;
    a first buffer layer of gallium nitride formed on the substrate;
    a second buffer layer of indium gallium nitride formed on the first gallium nitride buffer layer, said second buffer layer being treated with precursors selected from a group consisting of $In(CH_3)_3$ and $NH_3$; and
    an epitaxial layer of gallium nitride formed on the second buffer layer.

2. The epitaxial structure of claim 1, wherein the substrate is made of a material selected from a group consisting of sapphire, SiC, ZnO and Si.

3. The epitaxial structure of claim 1, further comprising a gallium nitride series epitaxial layer formed on a gallium nitride epitaxial layer.

4. The epitaxial structure of claim 1, wherein the first buffer layer of gallium nitride has a thickness of about 20 nm to 40 nm.

5. The epitaxial structure of claim 1, wherein the second buffer layer has a thickness of about 40 nm to 50 nm.

6. The epitaxial structure of claim 1, wherein the first buffer layer, the second buffer layer and the gallium nitride layer are grown by metal organic chemical vapor deposition (MOCVD).

7. The epitaxial structure of claim 1, wherein the first buffer layer comprises a multiple crystal structure.

8. The epitaxial structure of claim 1, wherein the second buffer layer comprises a single crystal structure.

9. The epitaxial structure of claim 1, wherein the epitaxial layer comprises a single crystal structure and has a defect density lower than $1 \times 10^8$ cm$^{-2}$.

10. The epitaxial structure of claim 1, wherein the epitaxial layer is made of $B_xAl_yIn_zGa_{1-x-y-z}N_pAs_q$ ($0 \leq x \leq 1$, $0 \leq y \leq 1$, $0 \leq z \leq 1$, $0 \leq p \leq 1$, $0 \leq q \leq 1$, x+y+z=1, and p+q=1), or a p-type $B_xAl_yIn_zGa_{1-x-y-z}N_pP_q$ ($0 \leq x \leq 1$, $0 \leq y \leq 1$, $0 \leq z \leq 1$, $0 \leq p \leq 1$, $0 \leq q \leq 1$, x+y+z=1, and p+q=1).

\* \* \* \* \*